United States Patent [19]

Angelopoulos et al.

[11] Patent Number: 5,300,208
[45] Date of Patent: Apr. 5, 1994

[54] FABRICATION OF PRINTED CIRCUIT BOARDS USING CONDUCTING POLYMER

[75] Inventors: Marie Angelopoulos, Briarcliff Manor; Wu-Song Huang, Poughkeepsie; Jae M. Park, Binghamton; James R. White, Owego, all of N.Y.

[73] Assignee: International Business Machines Corporation, Armonk, N.Y.

[21] Appl. No.: 393,605

[22] Filed: Aug. 14, 1989

[51] Int. Cl.⁵ .......................... C25D 5/02; C23C 28/00
[52] U.S. Cl. ....................................... 205/50; 205/125; 205/164
[58] Field of Search ................... 204/15; 205/125, 164

[56] References Cited

U.S. PATENT DOCUMENTS

| | | | |
|---|---|---|---|
| 3,424,698 | 1/1969 | Lupinski | 204/14.1 |
| 3,963,590 | 6/1976 | Deyrup | 204/30 |
| 4,217,183 | 8/1980 | Melcher | 204/15 |
| 4,325,780 | 4/1982 | Schulz | 156/659.1 |
| 4,486,463 | 12/1984 | Rubner et al. | 427/53.1 |
| 4,532,015 | 7/1985 | Boultinghouse et al. | 204/38.4 |
| 4,559,112 | 12/1985 | Tamamura et al. | 204/12 |
| 4,560,593 | 12/1985 | Naarmann et al. | 427/443.1 |
| 4,605,471 | 8/1986 | Mitchell | 156/645 |
| 4,615,907 | 10/1986 | Boeke et al. | 427/53.1 |
| 4,783,243 | 11/1988 | Ando | 204/15 |

FOREIGN PATENT DOCUMENTS

| | | |
|---|---|---|
| 0037988 | 10/1981 | European Pat. Off. . |
| 0184367 | 6/1986 | European Pat. Off. . |
| WO88/06064 | 8/1988 | PCT Int'l Appl. . |
| WO89/08375 | 9/1989 | PCT Int'l Appl. . |
| 2148608 | 5/1985 | United Kingdom . |

Primary Examiner—John Niebling
Assistant Examiner—Brendan Mee
Attorney, Agent, or Firm—Philip J. Feig; Stephen C. Kaufman

[57] ABSTRACT

A process for fabricating a printed circuit board concerns the use of a soluble, air-stable conducting polymer applied to plated through holes, blind holes or vias or to a predetermined portion of the printed circuit board surface for selectively metal plating on the polymer without the necessity of either an electroless plating bath or the use of precious metal seeds. A preferred conducting polymer is polyaniline. A preferred metal plating is preferably copper or a noble metal such as palladium or silver.

30 Claims, 2 Drawing Sheets

FABRICATION OF PRINTED CIRCUIT BOARDS USING CONDUCTING POLYMER

BACKGROUND OF THE INVENTION

The present invention relates to a process useful for fabricating printed circuit boards and particularly for the metallization of plated through holes in printed circuit boards. Specifically, the invention relates to the use of a conducting polymer layer for electrolytic metallization of printed circuit boards which eliminates the necessity for precious metal seeds and electroless copper baths in the manufacture of printed circuit boards.

Prior art processes for the metallization of plated through holes have usually included the step of seeding or using a catalyst, usually a noble metal salt, within the plated through hole. The next step has been to immerse the seeded circuit board in an electroless bath, usually copper, in order to plate a thin layer of copper, approximately 2 to 5 microns thick, in the plated through hole. The thin copper layer renders the plated through holes sufficiently conductive so that a thicker copper layer may be added by conventional electrolytic deposition.

While the described process is currently used in manufacturing printed circuit boards there are several drawbacks to the process. First, by their very nature, electroless baths are unstable and require close monitoring and control. Electroless copper baths fluctuate between being too stable resulting in plated through hole voids and being too active which results in homogenous decomposition of the bath. Second, formaldehyde which is probably the most commonly used reducing agent today in electroless copper baths is toxic and poses difficulties in waste treatment and disposal. Third, precious metal seeds are expensive and often have a limited useful lifetime.

Currently there are several techniques emerging in the industry which eliminate the necessity for precious metal seeds and electroless copper baths for printed circuit board manufacturing. In one technique a plated through hole is coated using a conductive colloidal graphite suspension (Black Hole Process, Olin Hunt Specialty Products). Once coated, the plated through hole is plated electrolytically, thus eliminating the need for electroless metal deposition. The described process is only useful for the plated through holes and is not extendable to plating extended printed circuit board surfaces. Therefore, while the described process is of value for full panel plating by substractive processing, it is of limited use for pattern electroplating.

The present invention concerns an electrically conductive polymer coating which may be applied to a printed circuit board composite substrate. Preferably, the polymer coating is applied from a non-aqueous or aqueous solvent followed by an electroplating process that is performed in an aqueous solution. Moreover, the polymer coating is stable in air since the polymer may be cast, painted, spin-coated or dip-coated onto a substrate and may even be removed from the substrate to generate a pattern.

The polymer coating in practicing the present invention covers a predetermined region of the printed circuit board varying from covering the entire substrate surface including any through hole, blind holes or vias to just coating any through holes, blind holes or vias. The polymer is sufficiently conductive that the composite may be electrolytically plated simply by immersion into a copper ion solution, such as a copper sulfate bath. The polymer film precludes the need for both precious metal seeds and electroless copper deposition prior to electrolytic metallization. Moreover, pattern electroplating using a thin film of conducting polymer according to the teachings of the present invention permits enhanced circuit line profiles which is an important consideration in fine line circuitization.

Polymers useful for the electrolytic metallization of printed circuit boards include substituted and unsubstituted polyanilines, substituted polyparaphenylenevinylenes, substituted and unsubstituted polythiophenevinylene, substituted and unsubstituted polyfuranvinylene, substituted and unsubstituted polypyrrolevinylene, substituted and unsubstituted polythiophenes, polyazines, substituted polyfurans, substituted polyselenophenes, substituted and unsubstituted poly-p-phenylene sulfides and polyacetylenes formed from soluble precursors.

The above conducting polymers useful in practicing the present invention contain a partially conjugated $\pi$ system. A solution is formed of the polymer. To the solution is added a doping species (dopant precursor) which on exposure to energy generates a dopant which dopes the polymer to the conducting state. The addition of the dopant results in an expansion of the extent of the conjugated $\pi$ system in the individual polymer molecule. It is not necessary to extend the conjugated $\pi$ system over the full extent of the molecule. It is only necessary to sufficiently extend the $\pi$ conjugated system of an individual molecule so that after the solvent is removed the $\pi$ conjugate part of an individual molecule is adjacent to a part of the $\pi$ conjugated part of an adjacent molecule. In the $\pi$ conjugated system an electron is essentially delocalized over the entire $\pi$ conjugated bonds. These electrons are more loosely bond and are available for electrical conduction. When an electric field is applied, an electron can flow along an individual molecule and hop from one molecule to an adjacent molecule in a region where the $\pi$ conjugated parts of the adjacent molecules overlap.

The conductive properties of these polymers and their uses are described in co-pending U.S. patent application Ser. No. 07/357,565, field May 26, 1989, entitled "Electrically Conductive Polymeric Materials and Uses Thereof" and assigned to the same assignee as the present patent application, which co-pending application is incorporated herein by reference.

The preferred polymers for the electrolytic metallization of printed circuit boards is polyaniline. A major advantage for the use of the polymer polyaniline in fabricating printed circuit boards according to the present invention is the relatively low cost of producing the polymer.

SUMMARY OF THE INVENTION

A principal object of the present invention is therefore, the provision of fabricating printed circuit boards using a conducting polymer film.

Another object of the present invention is the provision of fabricating printed circuit boards without the necessity of electroless metal baths and precious metal seeds.

Another object of the present invention is the provision of fabricating printed circuit boards using a conductive polymer which permits metallization of plated through holes, blind holes or vias and the printed circuit board surface.

A further object of the present invention is the provision of pattern electroplating printed circuit boards in a manner for enhancing circuit line profiles for fine line circuitization.

A still further object of the present invention is the provision of a printed circuit board fabricated using a conducting polymer film.

Further and still other objects of the present invention will become more clearly apparent when the following description is read in conjunction with the accompanying drawings.

DETAILED DESCRIPTION

Figure 1:
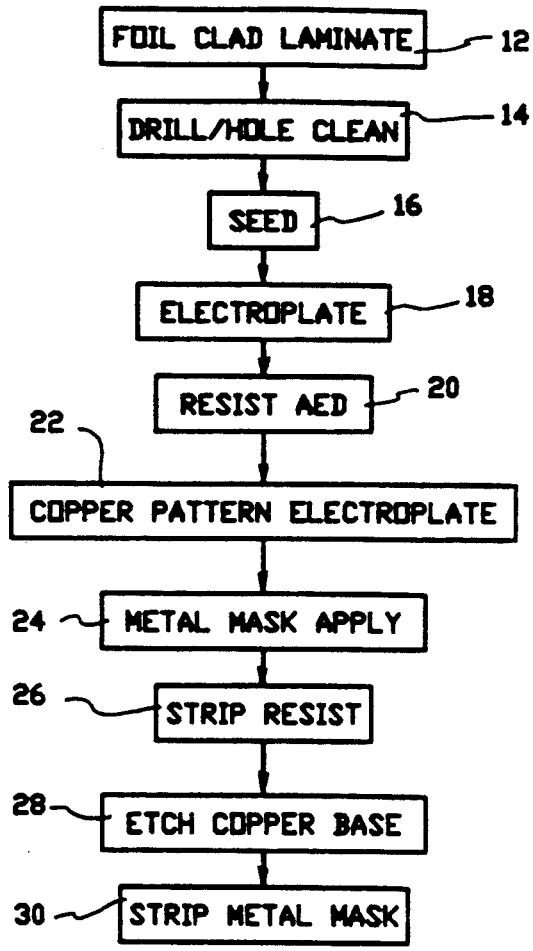
FIG. 1 is a flow diagram of a prior art printed circuit board fabrication process.

Referring now to the figures and to FIG. 1 in particular, there is shown a flow diagram of a conventional prior art process for fabricating a printed circuit board. Commencing with a foil clad laminate or substrate at step 12, a hole or pattern of holes to be plated are drilled into the laminate and cleaned in step 14. A precious metal seed layer is applied to the drilled and cleaned hole in step 16. Electroless metal plating in a metal ion bath, such as a copper sulfate/EDTA/formaldehyde bath, provides a thin layer of metal in the through hole in step 18. Photoesist is applied to the plated laminate in step 20 followed by expose and develop. Copper pattern electroplating of the through hole and printed circuit board assembly is achieved at step 22. A metal mask is applied in step 24 and the resist is stripped in step 26. A copper base is etched in step 28. The metal mask is stripped away in step 30.

Figure 3A:
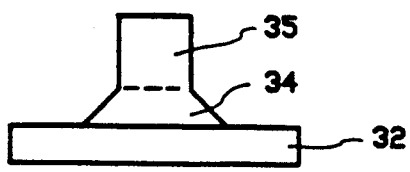
FIGS. 3A and 3B are cross-sectional diagrams of circuit line profiles formed according to the processes in FIGS. 1 and 2 respectively.

As seen in FIG. 3A, the circuit line profile of a metallized conductor on a laminate or substrate when practicing the prior art fabrication method contains a foil clad laminate or substrate 32, a superposed thin copper layer 34 applied during electroless metal plating, and a superposed thicker layer of electroplated copper 35. The thickness of copper layer 34 is in the range between 5 and 15 microns. The thickness of copper layer 35 is in the range between 15 and 50 microns.

Figure 2:
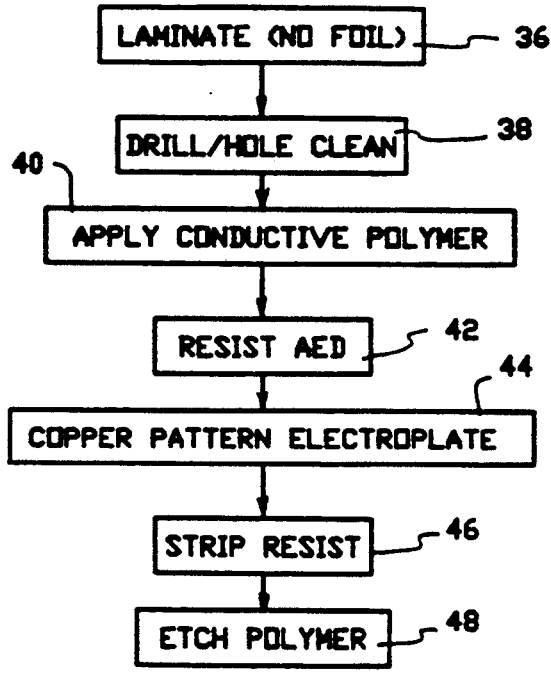
FIG. 2 is a flow diagram of a printed circuit board fabrication process in accordance with the present invention.

Referring to FIG. 2, the process according to the present invention commences at step 36 by providing a laminate or substrate without a foil clad. A hole or pattern of holes, which may be through holes, blind holes or vias, are drilled through the laminate and cleaned in step 38. In step 40 a conducting polymer is applied to predetermined locations such as circuit conductors and to the drilled and cleaned holes. Photoresist is applied in step 42 followed by expose and develop. Copper pattern electroplating upon the conducting polymer is performed in step 44. The resist is stripped away in step 46. In step 48 the polymer is etched.

Figure 3B:
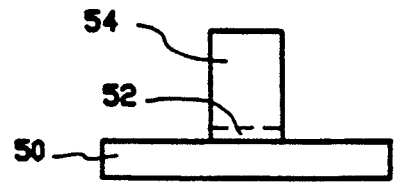

The circuit line or conductor profile when practicing the present invention is shown in FIG. 3B comprising a laminate or substrate 50 without foil clad, a thin conducting polymer layer 52 superposed at predetermined locations such as through holes and circuit conductors on the laminate 50, and a thicker layer of electroplated copper 54 superposed on the polymer layer 52. The thickness of the polymer layer is typically in the range between 0.5 and 10 microns. The thickness of the electroplated copper layer is typically in the range between 8 and 50 microns.

When practicing the process of the present invention the conducting polymer is applied in a manner to cover a predetermined area of the printed circuit board ranging from the entire laminate surface including the plated through holes to only plated through holes. The use of a foil clad laminate as in the conventionally known process is obviated by virtue of the laminate surfaces being rendered conductive by the polymer. The polymer selected must be sufficiently conductive that the composite may be electrolytically plated by immersion into a copper sulfate, or other metallic ion, solution. In this manner the need for a precious metal seed and for electroless copper plating prior to electrolytic metallization is also obviated. Moreover, it will be apparent by those skilled in the art that pattern electroplating using thin films of conducting polymers permits enhanced circuit line profiles, which is important in fine line circuitization.

Conducting polymers consist of a series of conjugated polymers which can be converted from an insulating or semiconducting regime to a metallic regime through chemical or electrochemical doping (oxidation for p-doping and reduction for n-doping or acid doping). As best known today, only p-doped conducting polymer are stable in air. Therefore, the present invention will discuss only p-doped conducting polymers. However, air stable n-doped conducting polymers would also be useful for practicing the present invention.

Figure 4A:
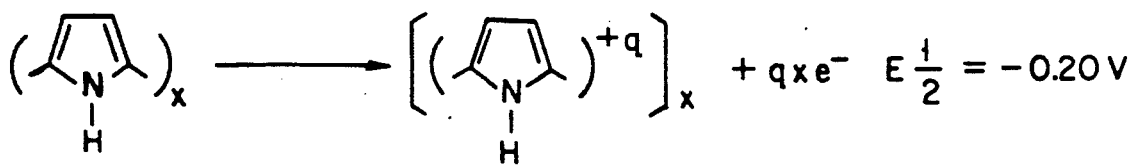
FIGS. 4A to 4G are chemical schematic diagrams and redox potentials of selected conducting polymers.
Figure 4B:
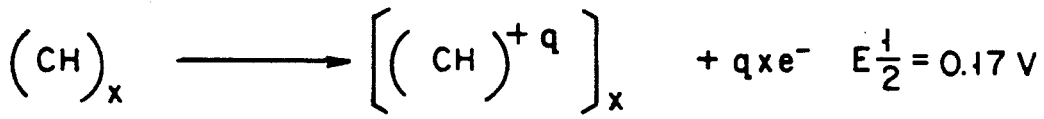
Figure 4C:
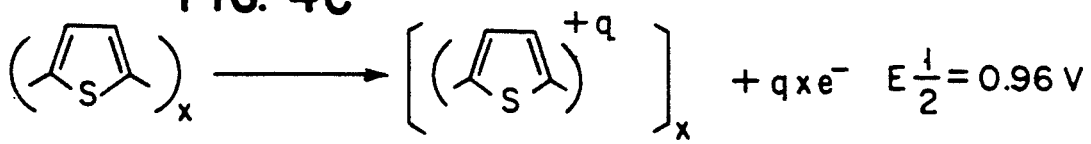
Figure 4D:
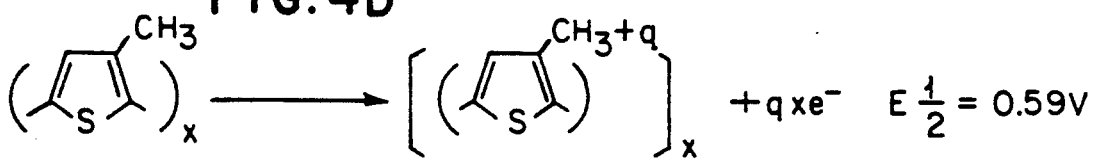
Figure 4E:
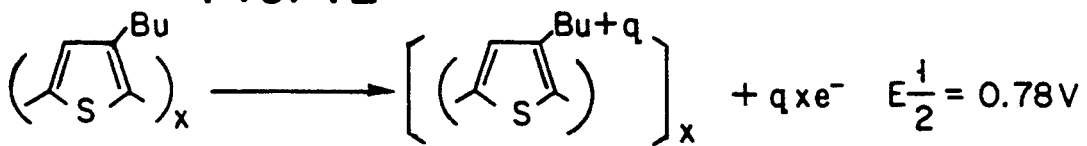
Figure 4F:
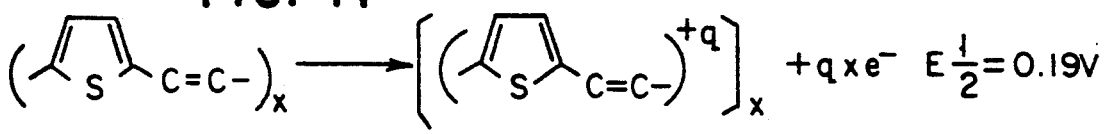
Figure 4G:
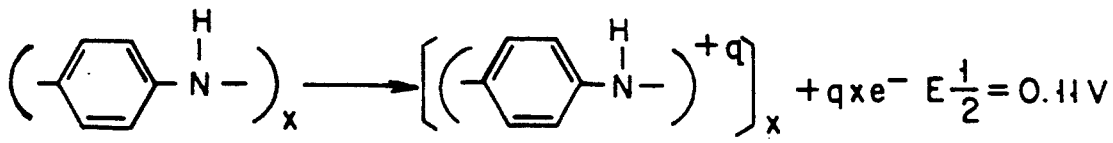

Generally, these p-doped air stable conducting polymers exhibit conducting characteristics only within certain pH and potential ranges. That is, there is a potential "window" defining a range within which each polymer is rendered conducting. When the potential is below the range, the polymer will be non-conducting and at a potential above the range, the polymer will decompose. FIGS. 4A to 4G show the chemical diagram and conducting (redox) potential of selected polymers. FIG. 4A is a schematic representation of the electrochemically synthesized polymer polypyrrole having a $E_{\frac{1}{2}}$ potential of $-0.20$ volts. FIG. 4B is a schematic representative of the polymer polyacetylene having a $E_{\frac{1}{2}}$ potential of 0.17 volts. FIG. 4C is a schematic representation of the electrochemically synthesized polymer polythiophene having a $E_{\frac{1}{2}}$ potential of 0.96 volts. FIG. 4D is a schematic representation of the polymer poly 3-methylthiophene having a $E_{\frac{1}{2}}$ potential of 0.59 volts. FIG. 4E is a schematic representation of the polymer poly 3-butylthiophene having a $E_{\frac{1}{2}}$ potential of 0.78 volts. FIG. 4F is a schematic representation of the polymer polythiophene vinylene having a $E_{\frac{1}{2}}$ potential of 0.19 volts. FIG. 4G is a schematic representation of the polymer polyaniline having a $E_{\frac{1}{2}}$ potential of 0.11 volts. In FIGS. 4A to 4G the value of q is in the range between 0.10 and 0.50. As used in conjunction with FIGS. 4A to 4G the value $E_{\frac{1}{2}}$ is the average of the anodic peak potential and the cathodic peak potential obtained from cyclic voltammetric studies found in the literature.

The potential range in which the polymer will be conducting is approximately between $E_{\frac{1}{2}} -0.3V$ and $E_{\frac{1}{2}} +0.3V$. In practice, most conducting polymers will exist at much larger potential ranges than that mentioned above.

The redox process in the electroplating of a metal M, with a redox potential of $E_{\frac{1}{2}}$, M can be simplified as the following reaction:

This invention is thermodynamically feasible when $E_{\frac{1}{2}}$, $M > E_{\frac{1}{2}}$, polymer For example, the redox potential of the reaction for copper from the electrochemical series table is 0.3402V vs. NHE (normal hydrogen electrode) or 0.0982V vs. SCE (standard calomel electrode). At the potential given, except for a relatively few polymers, most of the conducting polymers are nonconducting. As shown in FIG. 4A, polypyrrole is quite conductive at this potential, however polypyrrole is not suitable for practicing the present invention because it is nonsoluble. While polyalkythiophenes are soluble, they have slightly higher redox potentials. Therefore, the preferred polymer for the electrolytic metallization of printed circuit boards is polyaniline. While polyaniline is the preferred conducting polymer, similar results are achievable using other soluble air stable conducting polymers. The low cost of producing polyaniline is another advantage to its use in the process of fabrication printed circuit boards. Successful electroplating of copper on epoxy substrate containing a thin layer of polyaniline has been demonstrated.

After casting polyaniline on an epoxy substrate the polyaniline exhibits a much lower potential than the redox potential of certain precious metals such as Ag/Ag$^+$ and Pd/Pd$^{2+}$. Thus it has been observed that spontaneous plating of Pd and Ag thin film on polyaniline occurs without the introduction of a reducing agent in the electrolyte. The thin metallic layer so plated can then be used as an electrode for subsequent electroplating of copper. While this approach does not preclude the use of a precious metal as a base conducting layer it is has advantages over existing precious metal seed processes. The precious metal may be applied from a simple salt solution of the metal and avoids the use of expensive and unstable precious metal colloids. Further, no subsequent activation step is required for the precious metal prior to electrolytic plating of copper or other metals.

The principle and practice of the present invention will now be illustrated by the following examples which are exemplary only and not intended that the invention be limited thereto since modifications and variations in technique and operation will be apparent to those skilled in the art.

EXAMPLE I: SYNTHESIS OF POLYANILINE (EMERALDINE HYDROCHLORIDE AND EMERALDINE BASE)

An aqueous solution of ammonium persulfate (11.5 g) was added slowly to a solution of aniline (20 ml) dissolved in 1M aqueous HCl at approximately 5 degrees centigrade. After one hour the precipitate was filtered, washed repeatedly with 1.0M HCl and dried under dynamic vacuum for approximately 48 hours. The resultant emeraldine hydrochloride was converted to the emeraldine base by stirring with a 0.1M solution of ammonium hydroxide for several hours. The material was dried under dynamic vacuum for approximately 48 hours.

EXAMPLE II: ELECTROPLATING OF CU ON POLYANILINE

An epoxy substrate (approximately 2"×2") was first rinsed for several seconds with acetone then rinsed with distilled water. After the described cleaning, the epoxy substrate was blown dry in a nitrogen stream. Polyaniline (emeraldine base) was dissolved in 80% acetic acid and pasted on the cleaned and dried epoxy substrate at a temperature of approximately 100 to 110 degrees centigrade to a thickness of approximately 1 to 2 microns. By virtue of the described treatment the emeraldine base is converted to a conducting emeraldine salt. The conductivity of the coating was approximately 0.3 S/cm as measured by the 4-probe method. The epoxy substrate with a polyaniline coating was transferred to a 250 ml of electrolyte solution containing saturated copper sulfate (30 g of CuSO$_4$ in 250 ml of water). A piece of copper plate was used as a counter electrode and a 100 mA cathodic current was applied to the polyaniline working electrode by a PAR model 273 potentiostat. In the experiment, an alligator clip in slight contact with the solution was coupled to the polyaniline coated epoxy substrate. Bright copper film was deposited at the contact point between the clip and the polyaniline coating immediately upon application of the cathodic current. The area of the copper film continuously grew and spread outward while the cathodic current continued to be applied until the entire area covered with the polyaniline coating was covered with copper. After the entire area was covered with copper film, the current was maintained to increase the thickness of the copper film deposit.

Pure copper sulfate solution has a pH value in the range between 4 and 5. The pH value of the above described electrolyte was measured by pH paper to be approximately 3. The different pH is believed to be a result of the partial deprotonation of emeraldine hydroacetate during the experiment. It is known that polyaniline in its emeraldine oxidation state remains electroactive and electrically conductive when the electrolyte pH is less than 4. Therefore, the polyaniline polymer in the experimental conditions described remains electroactive and electrically conductive.

EXAMPLE III: SPONTANEOUS PLATING OF PD FILM ON POLYANILINE COAT FROM NMP

Polyaniline (emeraldine base) was dissolved in NMP (n-methyl pyrrolidinone) and the resulting polymer solution was cast on the surface of an epoxy substrate. The assembly was then heated to a temperature of approximately 120 to 130 degrees Centigrade in order to evaporate the NMP solvent. The dried assembly was dipped into an aqueous solution containing 0.05M palladium chloride and 0.06M hydrochloric acid. A thin palladium film slowly plated onto the polyaniline polymer surface.

EXAMPLE IV: ELECTROPLATING OF CU ON PD/POLYANILINE

Polyaniline (emeraldine base or emeraldine salt) was dissolved in pyrrolidine and then painted onto an epoxy substrate at a temperature of approximately 90 to 100 degrees Centigrade while on a hot plate in an exhaust hood. The pyrrolidine evaporated within a few seconds after painting and all that remained was a thin coating of the polymer. The above described painting process was repeated several additional times until a copper glint color appeared on the surface. The epoxy substrate covered with the polyaniline polymer coating was maintained on the hot plate for an additional 10 to 15 minute period to remove by evaporation any residue pyrrolidine solvent. The entire assembly was then dipped into an aqueous solution containing 0.01M palladium chloride and 0.012M hydrochloric acid (or 0.05M palladium chloride and 0.06M hydrochloric acid). A shiny metallic Pd film slowly formed on the polyaniline surface. After the entire polyanilne coating was covered with a thin film of palladium, electroplating of copper was performed on the epoxy substrate—polyaniline polymer—Pd assembly under the same conditions as described in Example II. Bright copper film was plated homogeneously on the entire palladium surface immediately upon the application of a cathodic current to the assembly. The thickness of the Cu film increased while the cathodic current continued to be applied.

EXAMPLE V: SPONTANEOUS PLATING OF AG FILM ON POLYANILINE

Polyaniline (emeraldine base) was dissolved in pyrrolidine and the solution was then applied to the surface of an epoxy substrate as described in Example III above. The epoxy substrate covered with the polyaniline polymer coating was transferred into a 200 ml aqeous solution containing 1.40 g of silver toluene sulfonate and 0.76 g of toluene sulfonic acid. A thin layer of Ag film slowly began to appear on the surface of the polyaniline polymer.

EXAMPLE VI: ELECTROPLATING OF CU ON POLYANILINE—GRAPHITE COMPOSITION

A polyaniline coating on an epoxy substrate was prepared as described in Example II above, except that a graphite suspension was mixed with the polyaniline in 80% acetic acid. Upon the application of a cathodic current to the polyaniline—graphite composite coating, copper immediately plated at the contact point of the alligator clip and spread to the entire surface of the coating at a faster speed than in Example II. It is believed that the increased spread is due to the increased conductivity of the polyaniline polymer achieved by the inclusion of graphite.

In an alternative embodiment, a conducting polymer such as those described above containing a substance which decomposes upon being exposed to a source of energy for producing a dopant for the polymer is disposed onto a substrate and a predetermined region of the polymer is exposed to a source of energy. The region exposed to the source of energy is rendered conductive for subsequent plating according to the present invention. Preferred sources of energy include electromagnetic radiation, an electron beam and heat. Preferred substances to the conducting polymer are triflate salts, borate salts, and tosylates salts for heat sources of energy and onium salts, iodonium salts, and sulfonyloxyimides for a electromagnetic radiation sources of energy such as UV radiation and E-beam radiation, as described in U.S. patent application Ser. No. 07/357,565. The predetermined region is preferably a pattern of conductors.

While there has been described and illustrated a preferred embodiment of the present invention and several modifications and variations thereof, it will be apparent to those skilled in the art that further modifications and variations are possible without deviating from the broad principle of the present invention which shall be limited solely by the scope of the claims appended hereto.

What is claimed is:

1. A process for fabricating a printed circuit board comprising the steps of:
   providing a substrate;
   applying an inherently electrically conducting polymer containing a partially conjugated $\pi$ system which polymer is capable of being applied from a non-aqueous or aqueous solvent and is capable of being applied by casting, painting, spin-coating or dip-coating, to a predetermined portion of said substrate, and
   electroplating a metal film from a conventional aqueous electroplating solution onto said conducting polymer.

2. A printed circuit board fabricated according to the process set forth in claim 1.

3. A process for fabricating a printed circuit board as set forth in claim 1, further comprising the step of drilling and cleaning at least one hole in said substrate and applying said conducting polymer to said at least one hole.

4. A printed circuit board fabricated according to the process set forth in claim 3.

5. A process for fabricating a printed circuit board as set forth in claim 1 further comprising the steps of:
   applying, exposing and developing a photoresist on said conducting polymer; stripping said photoresist after said electroplating, and etching said conducting polymer.

6. A process for fabricating a printed circuit board as set forth in claim 3 further comprising the steps of:
   applying, exposing and developing a photoresist on said conducting polymer; stripping said photoresist after said electroplating, and etching said conducting polymer.

7. A printed circuit board fabricated according to the process set forth in claim 5.

8. A printed circuit board fabricated according to the process set forth in claim 6.

9. A process for fabricating a printed circuit board as set forth in claims 1, 3, 5 or 6 wherein the conducting polymer is selected from the group consisting of substituted and unsubstituted polyaniline, substituted polyparaphenylenevinylenes, substituted and unsubstituted polythiophenevinylene, substituted and unsubstituted polyfuranvinylene, substituted and unsubstituted polypyrrolevinylene, substituted and unsubstituted polythiophenes, polyazines, substituted polyfurans, substituted polyselenophenes, substituted and unsubstituted poly-p-phenylene sulfides and polyacetylenes formed from soluble percursors.

10. A process for fabricating a printed circuit board as set forth in claim 9, wherein the metal film is a film comprising a metal having a redox potential which is more positive than the redox potential of the conducting polymer.

11. A process for fabricating a printed circuit board as set forth in claim 10, wherein the metal film is a noble metal film.

12. A process for fabricating a printed circuit board as set forth in claim 11, wherein said metal film is a precious metal film selected from group consisting of silver and palladium.

13. A process for fabricating a printed circuit board as set forth in claim 10, wherein the metal film is copper film.

14. A printed circuit board fabricated according to the process set forth in claim 10.

15. A process for fabricating a printed circuit board as set forth in claim 1, 3, 5 or 6 wherein said predetermined portion of said substrate is at least one circuit line.

16. A process for fabricating a printed circuit board as set forth in claim 9, wherein said predetermined portion of said substrate is at least one circuit line.

17. A printed circuit board fabricated according to the process set forth in claim 15.

18. A printed circuit board fabricated according to the process set forth in claim 16.

19. A process for fabricating a printed circuit board as set forth in claim 1, 3, 5, or 6, wherein said applying a conducting polymer is by casting, painting, spin-coating or dip coating.

20. A process for fabricating a printed circuit board as set forth in claim 9 wherein said applying a conducting polymer is by casting, printing spin-coating or dip coating.

21. A process for fabricating a printed circuit board comprising the steps of:
  providing a substrate;
  applying a conducting polymer containing a partially conjugated $\pi$ system and containing a substance which decomposes upon being exposed to a source of energy for producing a dopant for the polymer to said substrate;
  selectively exposing a predetermined region of the polymer to a source of energy for rendering said predetermined region conductive, and
  electroplating a metal film from a conventional aqueous electroplating solution onto said conductive predetermined region.

22. A process as set forth in claim 21 wherein said source of energy is electromagnetic radiation.

23. A process as set forth in claim 21 wherein said source of energy is an electron beam.

24. A process as set forth in claim 22 wherein said source of energy is heat.

25. A process as set forth in claim 21 wherein said predetermined portion is at least one circuit line.

26. A printed circuit board fabricated according to the process set forth in claim 21.

27. A method of spontaneous plating precious metals on a conducting polymer comprising the steps of:
  providing a substrate;
  applying an inherently electrically conducting polymer containing a partially conjugated $\pi$ system coating, which polymer is capable of being applied from a non-aqueous or aqueous solvent and is capable of being applied by casting, painting, spin-coating or dip-coating, to a predetermined portion of said substrate; and
  disposing the polymer coated substrate in a plating bath containing a precious metal salt, where the potential of the conducting polymer is lower than the redox potential of the precious metal, whereby the precious metal spontaneous plates on the conducting polymer.

28. A method of spontaneous plating precious metals on a conducting polymer as set forth in claim 27, wherein said conducting polymer is polyaniline.

29. A method of spontaneous plating precious metals on a conducting polymer as set forth in claim 27, wherein said precious metal is selected from the group consisting of silver and palladium.

30. A method of spontaneous plating precious metals on a conducting polymer as set forth in claim 29, wherein said conducting polymer is polyaniline.

* * * * *